United States Patent
Loth

(10) Patent No.: US 7,612,611 B2
(45) Date of Patent: Nov. 3, 2009

(54) AMPLIFIER CIRCUIT

(75) Inventor: Andreas Loth, Ulm (DE)

(73) Assignee: Atmel Automotive GmbH, Heilbronn (DE)

( * ) Notice: Subject to any disclaimer, the term of this patent is extended or adjusted under 35 U.S.C. 154(b) by 0 days.

(21) Appl. No.: 12/058,450

(22) Filed: Mar. 28, 2008

(65) Prior Publication Data
US 2008/0238551 A1  Oct. 2, 2008

Related U.S. Application Data

(60) Provisional application No. 60/907,325, filed on Mar. 28, 2007.

(51) Int. Cl.
*H03G 3/10* (2006.01)
(52) U.S. Cl. .................. 330/285; 330/296
(58) Field of Classification Search ............ 330/285, 330/296, 254
See application file for complete search history.

(56) References Cited

U.S. PATENT DOCUMENTS

| 6,930,555 | B2 * | 8/2005 | Bachhuber et al. | 330/285 |
| 7,113,043 | B1 * | 9/2006 | Jin et al. | 330/279 |
| 7,167,045 | B1 * | 1/2007 | Son et al. | 330/130 |
| 7,184,799 | B1 * | 2/2007 | Jin et al. | 455/574 |

* cited by examiner

*Primary Examiner*—Henry K Choe
(74) *Attorney, Agent, or Firm*—Muncy, Geissler, Olds & Lowe, PLLC

(57) ABSTRACT

An amplifier circuit for amplifying a high-frequency input signal comprises an amplifier stage, which amplifies the high-frequency input signal as a function of an operating point of the amplifier stage and generates an operating point-dependent signal, an observer stage, which replicates the amplifier stage and generates an observation signal, a regulator, which is supplied with the operating point-dependent signal and the observation signal, and an control element, which influences the operating point of the amplifier stage and is driven by the regulator, whereby the regulator drives the control element in such a way that the operating point of the amplifier stage is substantially independent of a level of the high-frequency input signal.

15 Claims, 4 Drawing Sheets

AMPLIFIER CIRCUIT

This nonprovisional application claims priority to U.S. Provisional Application No. 60/907,325, which was filed on Mar. 28, 2007, and which is herein incorporated by reference.

BACKGROUND OF THE INVENTION

1. Field of the Invention

The invention relates to an amplifier circuit for amplifying a high-frequency input signal.

2. Description of the Background Art

Amplifier circuits for amplifying a high-frequency input signal, as is generated, for example, in wireless data transmission from a receiver antenna, frequently comprise an amplifier stage, which amplifies the high-frequency input signal as a function of an operating point of the amplifier stage.

An undesirable property of conventional amplifier stages is that their operating point depends on a level of the high-frequency input signal. The cause of this, for example, may be that an average base-emitter current of an amplifier stage bipolar transistor, wired as an amplifier, increases with an increasing level of the high-frequency input signal; as a result, the operating point of the bipolar transistors shifts and an available output voltage swing is reduced.

SUMMARY OF THE INVENTION

It is therefore an object of the present invention to provide an amplifier circuit, which operates reliably over a broad level range of the input signal and which substantially does not exhibit an operating point shift, particularly at high levels.

According to the invention, the amplifier circuit for amplifying a high-frequency input signal comprises an amplifier stage, which amplifies the high-frequency input signal as a function of the amplifier stage operating point and generates an operating point-dependent signal, an observer stage, which replicates the amplifier stage, particularly in its electrical properties, and generates an observation signal, a regulator, which is supplied with the operating point-dependent signal and the observation signal, and a control element, which influences the operating point of the amplifier stage and is driven by the regulator, whereby the regulator drives the control element in such a way that the operating point of the amplifier stage is substantially independent of a high-frequency input signal level. An operating point shift of the amplifier stage is detectable by the observer stage, which is not supplied with the high-frequency input signal; here, the regulator substantially compensates for this operating point shift by suitable driving of the control element acting on the amplifier stage. Hence, an operating point shift due to an increasing input level may be avoided. The regulator can be designed, for example, as a P, PI, PD, or PID regulator or implement other suitable control algorithms as well.

In a further embodiment, the amplifier stage comprises a transistor, which acts as an amplifier and is wired, for example, into the emitter circuit or source circuit. A terminal, for example, an emitter or source terminal, of the transistor may be connected to a reference potential, for example, ground. The amplifier stage comprises further a capacitive coupling element, which is looped between an input terminal of the input signal and a control terminal of the transistor, a bias signal-generating circuit to generate a bias signal, which is applied at the control terminal of the transistor, and a load element with at least one terminal, which is looped in series with a collector-emitter path or a drain-source path of the transistor between a supply voltage and a reference potential, whereby the amplified input signal or a signal derived from the input signal is applied at the at least one terminal of the load element. The signal dependent on the amplifier circuit operating point is preferably generated or derived from the amplified input signal, for example, by a transformation or conversion means. Preferably, at least one resistor is looped as a transformation means between the at least one terminal of the load element at which the amplified input signal or the signal derived from the input signal is applied, and a terminal at which the signal dependent on the amplifier stage operating point is applied. If the load element has a plurality of terminals, an associated resistor can be looped between each of the plurality of terminals and the terminal at which the signal dependent on the amplifier stage operating point is applied.

In a further embodiment, the observer stage comprises a transistor at whose control terminal the bias signal is applied and which replicates the transistor of the amplifier stage; i.e., the transistor of the observer stage is implemented, for example, in an integrated circuit, in such a way that its electrical properties substantially correspond to those of the transistor of the amplifier stage. The observer stage comprises at least one load element with at least one terminal, which is looped in series with the collector-emitter path or the drain-source path of the transistor of the observer stage between the supply voltage and the reference potential and which replicates the load element of the amplifier stage as described above, whereby the observation signal is applied at the at least one terminal of the load elements of the observer stage.

In a further embodiment, the control element comprises a controllable resistor, which is looped between the control terminal of the transistor of the amplifier stage and the reference potential. As the amplitude or the level of the high frequency input signal changes, because of the operating point shift, the operating point-dependent signal, which forms one of the regulator input signals, also changes accordingly. The observation signal, which forms the other signal of the two regulator input signals, remains constant, however. Consequently, a difference between the two regulator input signal forms, which the regulator reproduces according to its regulator algorithm in a suitable output signal. The output signal of the regulator is changed with an increasing level of the high-frequency input signal in such a way that the resistance value of the controllable resistor declines, as a result of which the current or the current rise or a voltage or a voltage rise at the control terminal of the transistor is changed by such a value that the operating point of the transistor substantially remains constant. Hence, an operating point shift due to an increasing input level may be avoided. With an unchanging input level and changing bias signal, the input signals of the regulator substantially change in the same way, because the observer stage is supplied with the bias signal. The output signal of the regulator subsequently remains constant as desired.

In a further embodiment of the amplifier circuit, the controllable resistor is a field-effect transistor, particularly a MOS field-effect transistor. The amplifier circuit can preferably be a component of an integrated circuit or be integrated into an integrated circuit. Preferably, the integrated circuit is realized using BiCMOS or BiMOS technology, because both bipolar and CMOS elements can be realized using this technology. Alternatively, the controllable resistor may also be a bipolar transistor.

In a further embodiment of the amplifier circuit, said circuit comprises a first mixer, whereby the load element of the amplifier stage and the first mixer are looped in series between the supply voltage and a terminal, for example, a collector terminal, of the transistor of the amplifier stage, and a second mixer, whereby the load element of the observer stage and the second mixer are looped in series between the supply voltage and a terminal, for example, a collector terminal, of the transistor of the observer stage, and the second mixer replicates the first mixer. This makes possible a combined amplifier/mixer stage, i.e., the mixer is operated by the current flowing through the transistor, as a result of which additional circuit parts, for example, a current mirror, to supply the mixer with the amplified high-frequency input signal can be eliminated. With the replication of the mixer in the observer stage, its effect can also be taken into account. Alternatively or in addition, the mixer can also be replaced or supplemented by a cascode stage.

In a further embodiment of the amplifier circuit, the transistors of the amplifier stage and the observer stage are bipolar transistors. Alternatively, the transistors of the amplifier stage and the observer stage are MOS transistors.

In a further embodiment of the amplifier circuit, the regulator and/or the control element are made digital.

In a further embodiment of the amplifier circuit, the observer stage replicates the amplifier stage in such a way that there is a scaled relationship or a predefined ratio between elements of the amplifier stage and the corresponding elements of the observer stage relative to element parameters, for example, electrical parameters and/or layout parameters of the elements. For example, a transistor of the observer stage may be 10 times smaller than the corresponding transistor of the amplifier stage and/or a current through the transistor of the observer stage may be 10 times smaller than a corresponding current through the transistor of the amplifier stage. In other words, the observer stage can be scaled relative to the amplifier stage, i.e., be scaled up or down. This makes possible current-saving operation of the amplifier circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
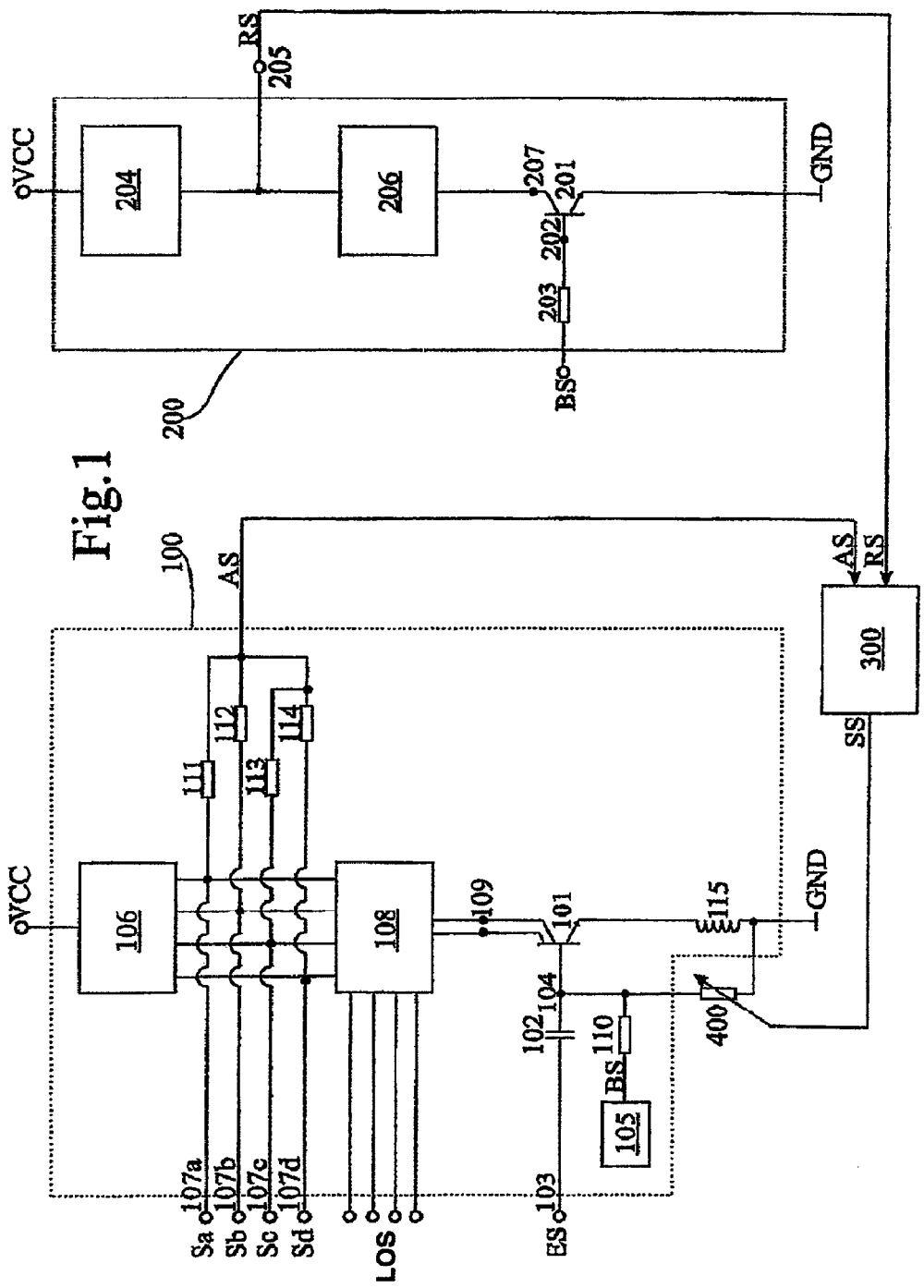
FIG. 1 is a block diagram of a first embodiment of an amplifier circuit for amplifying and mixing a high-frequency input signal.

FIG. 1 shows a block diagram of an amplifier circuit for amplifying and mixing a high-frequency input signal ES. The amplifier circuit comprises an amplifier stage 100, an observer stage 200, a regulator 300, and a controllable resistor 400.

Amplifier stage 100 amplifies the high-frequency input signal ES as a function of an operating point of amplifier stage 100, mixes the amplified input signal with a preferably rectangular differential quadrature signal LOS of a local oscillator (not shown), and outputs a signal AS dependent on the operating point of amplifier stage 100. The operating point of amplifier stage 100 is substantially determined by an average current, which flows through a base-emitter path of a bipolar transistor 101 of amplifier stage 100, which functions as an amplifier. The average base-emitter current in turn determines the average collector or drain current.

Observer stage 200 replicates amplifier stage 100 and generates an observation signal RS. Regulator 300 is supplied with the operating point-dependent signal AS and the observation signal RS and controls a control element in the form of a controllable resistor 400. The control element or resistor 400 influences the operating point of amplifier stage 100. Regulator 300 drives resistor 400 in such a way that the operating point of the amplifier stage 100 is substantially independent of the level of a high-frequency input signal ES.

Amplifier stage 100 comprises the npn bipolar transistor 101 with two collectors, a capacitive coupling element 102, which is looped between an input terminal 103 for the input signal ES and a base terminal 104 of bipolar transistor 101, a bias signal-generating circuit 105 to generate a bias signal BS, which is applied via a series resistor 110 at the base terminal 104 of bipolar transistor 101, a load element 106, whereby the amplified and mixed input signal VSa to VSd is applied at terminals 107a through 107d of load element 106, resistors 111 to 114, which form the operating point-dependent signal AS from the amplified and mixed input signal VSa to VSd by superposition of the signal components VSa to VSd, and an I/Q mixer 108, whereby the load element 106 and the I/Q mixer 108 are looped in series between a supply voltage VCC and collector terminals 109 of bipolar transistor 101. The amplified signal or its components VSa through VSd form a differential I/Q signal in an intermediate frequency range or in the baseband, which is generated by amplification of the input signal ES and conditioning or mixing of the amplified signal by I/Q mixer 108.

I/Q mixer 108 is driven by the signal LOS and converts the amplified, high-frequency input signal ES, for example, by multiplying with the signal LOS, into a signal in the baseband or in an intermediate frequency range.

The bias signal BS is generated by bias signal-generating circuit 105 in such a way that the temperature dependence of bipolar transistor 101 is substantially compensated.

A component acting inductively between the emitter terminal of bipolar transistor 101 and the reference potential GND is shown in the equivalent circuit as a discrete inductor 115. It is understood that the emitter terminal of bipolar transistor 101 may be connected directly to the reference potential GND, whereby discrete inductor 115 indicates only the inductive component, which is active in the high-frequency operation between the emitter terminal of bipolar transistor 101 and the reference potential.

Observer stage 200, which replicates amplifier stage 100, comprises an npn bipolar transistor 201, at whose base terminal 202 the bias signal BS is applied via a resistor 203 and which replicates bipolar transistor 101 of amplifier stage 100, a load element 204, which replicates load element 106 of amplifier stage 100, whereby the observation signal RS is applied at a terminal 205 of load element 204, and a mixer 206, whereby load element 204 and mixer 206 are looped in series between the supply voltage VCC and a collector terminal 207 of bipolar transistor 201, and mixer 206 replicates mixer 108 of amplifier stage 100. The observer stage replicates the amplifier stage in a 1:1 ratio. Alternatively, observer stage 200 may also replicate the amplifier stage using another ratio, for example, 1:10. In this case, there is a ratio of 10:1 between parameters (current, voltage, size, area, etc.) of elements 108 and 101 of amplifier stage 100 and parameters of elements 206 and 201 of observer stage 100. This also applies to a ratio of the current through transistors 101 and 201; i.e., there is a 1:10 ratio between the resistance values of load elements 106 and 204.

Regulator 300 is supplied with the operating point-dependent signal AS at a first input and with the observation signal RS at a second input. At its output, regulator 300 outputs a signal SS, which depends on the signals AS and RS applied at its inputs.

The control element in the form of the controllable resistor 400 is looped between base terminal 104 of bipolar transistor 101 of amplifier stage 100 and the reference potential GND and is driven by the output signal SS of regulator 300. Controllable resistor 400 is designed as a MOS field-effect transistor.

The output signal SS of regulator 300 functions to drive controllable resistor 400. As the amplitude or the level of the input signal ES increases, the operating point-dependent signal AS, which forms one of the input signals of regulator 300, declines accordingly. The observation signal RS, which forms the other signal of the two input signals of regulator 300, remains constant, however. Hence, a difference results between the two input signals RS and AS of regulator 300 or the difference between the two input signals RS and AS increases, whereby said difference is reproduced by regulator 300 according to its control algorithm in the output signal SS. The output signal SS of regulator 300 is changed with an increasing level of the high-frequency input signal ES, i.e., with a changing operating point, in such a way that the resistance value of controllable resistor 400 declines; as a result, an increase in current through the base-emitter path of bipolar transistor 101 is in turn reduced by such an amount that the operating point, dependent on this current, of bipolar transistor 101 remains substantially constant. Hence, an operating point shift due to an increasing input level may be avoided.

Preferably, the control algorithm of regulator 300 is designed in such a way that the output signal SS remains constant below a level threshold of the input signal ES independent of the level; i.e., regulator 300 is inactive below the level threshold. Regulator 300 can be made as a digital regulator. Control element 400, in contrast to what is shown in the figures, may also be made digital or may comprise, in addition to analog circuit elements such as transistors, also digital circuit elements, for example, a R-2R network, a logic gate, etc.

When the input level remains constant and only the bias signal BS changes as a function of temperature, the input signals AS and RS of regulator 300 substantially change in the same way, because observer stage 200 is supplied with the bias signal BS. The output signal SS of regulator 300 subsequently remains constant as desired.

Figure 2:
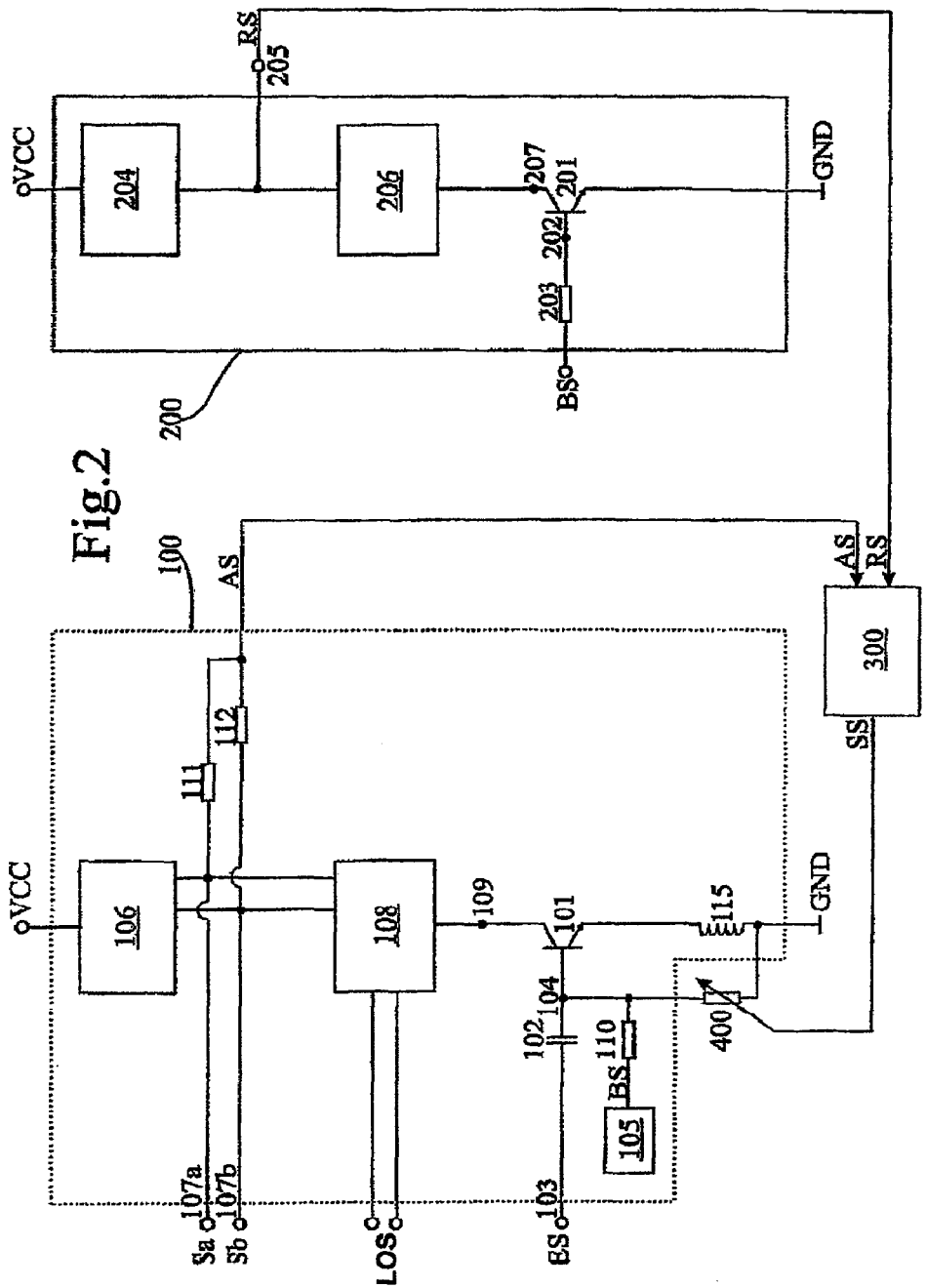
FIG. 2 is a block diagram of another embodiment of an amplifier circuit for amplifying and mixing a high-frequency input signal.
Figure 3:
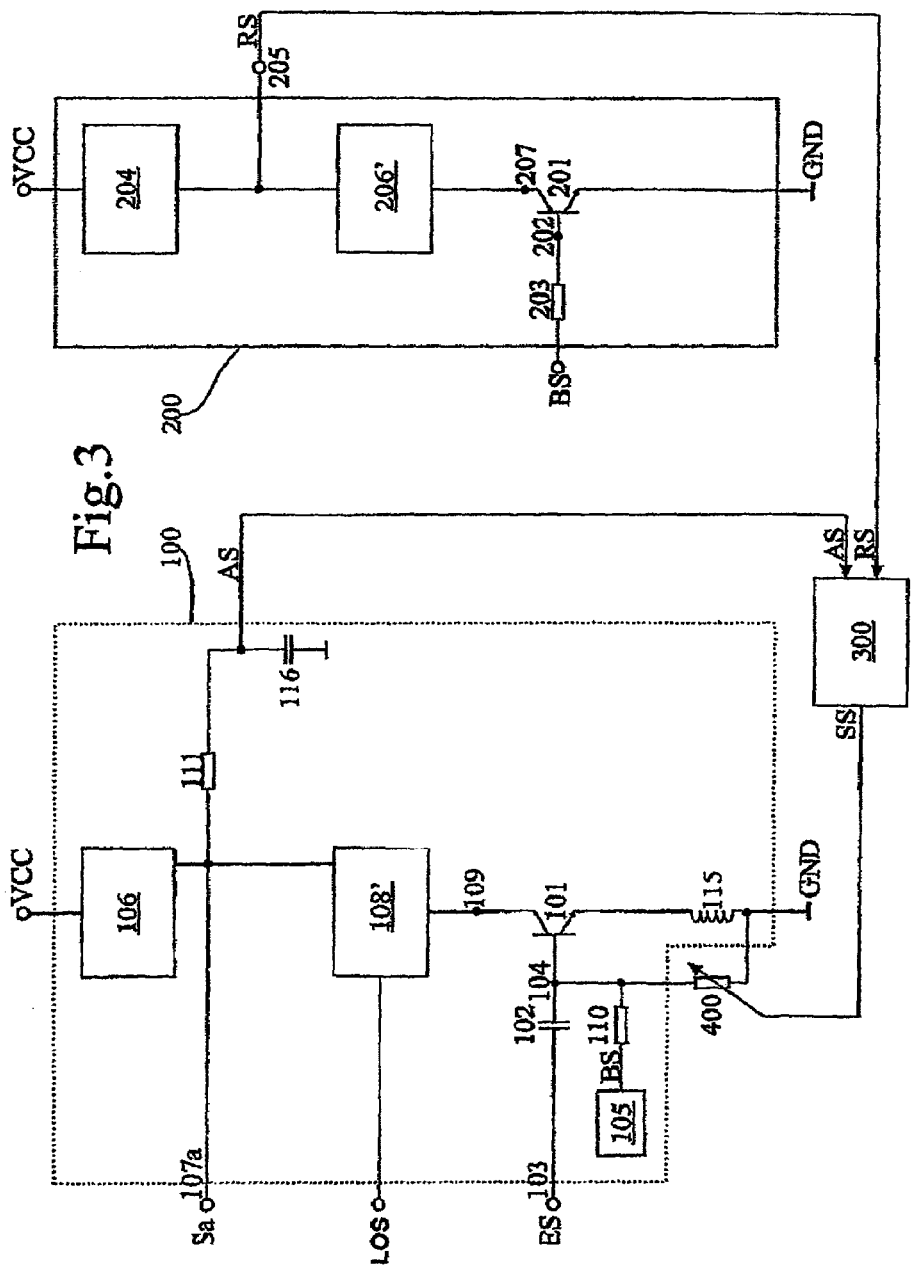
FIG. 3 is a block diagram of another embodiment of an amplifier circuit for amplifying a high-frequency input signal.

FIGS. 2 and 3 show block diagrams of alternative embodiments of the amplifier circuit shown in FIG. 1. The same reference characters in the figures designate the same elements. In the embodiment shown in FIG. 2, mixer 108 is a so-called single-balanced mixer; i.e., only the two outputs 107a and 107b are provided instead of the four outputs 107a through 107d in FIG. 1, and bipolar transistor 101 comprises only one collector terminal 109. The signal LOS in this embodiment comprises two signal components which have a phase difference of 180 degrees. In the embodiment shown in FIG. 3, mixer 108 is replaced by a cascode stage or a cascode circuit 108', which is replicated in observer stage 200 by a corresponding cascode stage 206'. In this case, only the amplified input signal ES, which in this embodiment is not subjected to frequency conversion, is applied at output 107a. The operating point-dependent signal AS is smoothed in this embodiment by a capacitor 116. The signal LOS in this embodiment comprises only one signal component, i.e., a direct voltage at the base of a cascode transistor.

Figure 4:
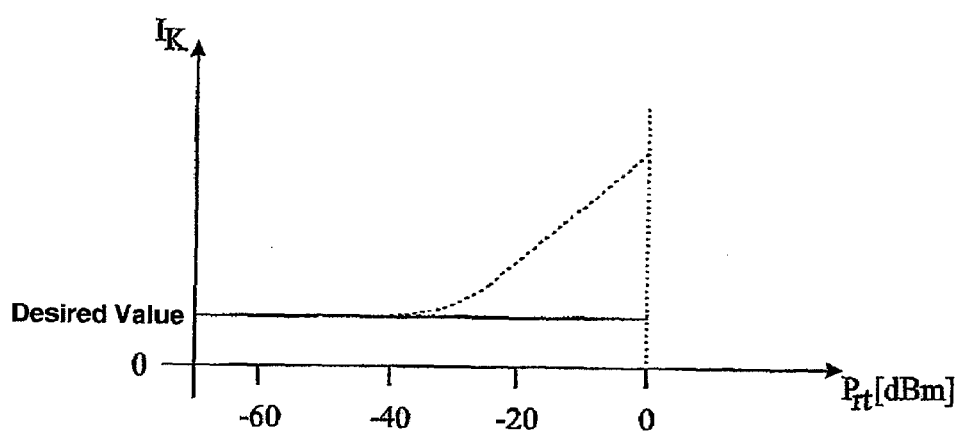
FIG. 4 shows a curve for an average collector or drain current of a bipolar transistor of the amplifier circuit of FIG. 1 as a function of a level of the high-frequency input signal is compared with a conventional amplifier circuit.

FIG. 4 shows the course (shown as a solid line) of the collector current $I_K$ of bipolar transistor 101 of amplifier circuit 100 in FIGS. 1 through 3 as a function of a level $P_{rt}$ of the high-frequency input signal ES, in comparison with a conventional amplifier circuit (shown as a broken line). As is evident from FIG. 2, the collector current $I_K$ of bipolar transistor 101 of the amplifier circuit according to the invention remains constant over the shown level range of the input signal ES; i.e., the operating point of the amplifier circuit remains stable.

In summary, the amplifier circuit comprises amplifier stage 100, observer stage 200, which replicates amplifier stage 100, regulator 300 and controllable resistor 400, whereby an operating point shift of amplifier stage 100 is detectable by means of observer stage 200 and regulator 300 drives controllable resistor 400 in such a way that the operating point of amplifier stage 100 remains substantially constant.

The depicted amplifier circuit can be a component of an integrated circuit (not shown). Preferably, the integrated circuit is realized using BiCMOS or BiMOS technology, because in this technology both the bipolar transistors 101 and 201 and the controllable resistor 400, made as a MOS field-effect transistor, may be realized in a single integrated circuit.

The amplifier circuit can be used, for example, in an HF input circuit of a wireless receiver, which is used for access control in motor vehicles.

The shown exemplary embodiments realize an amplifier circuit, which operates reliably over a broad level range of the input signal and which substantially does not exhibit an operating point shift particularly at high levels.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. Amplifier circuit for amplifying a high-frequency input signal, the amplifier circuit comprising:
   an amplifier stage that amplifies the high-frequency input signal as a function of an operating point of the amplifier stage and generates an operating point-dependent signal;
   an observer stage that replicates the amplifier stage and generates an observation signal;
   a regulator that is supplied with the operating point-dependent signal and the observation signal; and
   a control element that influences the operating point of the amplifier stage and is driven by the regulator,
   wherein the regulator drives the control element in such a way that the operating point of the amplifier stage is substantially independent of a level of the high-frequency input signal.

2. The amplifier circuit according to claim 1, wherein the amplifier stage comprises:
- a transistor;
- a capacitive coupling element that is looped between an input terminal of the input signal and a control terminal of the transistor;
- a bias signal-generating circuit that generates a bias signal that is applied at the control terminal of the transistor; and
- a load element having at least one terminal, which is looped in series with a collector-emitter path or a drain-source path of the transistor between a supply voltage and a reference potential,
- wherein the amplified input signal is applied at the at least one terminal of the load element and the signal, based on an operating point of the amplifier stage, is generated from the amplified input signal.

3. The amplifier circuit according to claim 2, wherein a resistor is looped between the at least one terminal of the load element at which the amplified input signal is applied and a terminal at which the signal dependent on the operating point of the amplifier stage is applied.

4. The amplifier circuit according to claim 2, wherein the observer stage comprises:
- a transistor at whose control terminal the bias signal is applied and which replicates the transistor of the amplifier stage; and
- a load element having at least one terminal, which is looped in series with the collector-emitter path or the drain-source path of the transistor of the observer stage between the supply voltage and the reference potential and which replicates the load element of the amplifier stage,
- wherein the observation signal applied at the at least one terminal of the load element.

5. The amplifier circuit according to claim 2, wherein the control element comprises a controllable resistor, which is looped between the control terminal of the transistor of the amplifier stage and the reference potential.

6. The amplifier circuit according to claim 5, wherein the controllable resistor is a field-effect transistor.

7. The amplifier circuit according to claim 6, wherein the field-effect resistor is a MOS field-effect transistor.

8. The amplifier circuit according to claim 5, wherein the controllable resistor is a bipolar transistor.

9. The amplifier circuit according to claim 2, wherein the bias signal-generating circuit generates the bias signal in such a way that the amplification factor of the amplifier circuit is substantially independent of temperature.

10. The amplifier circuit according to claim 1, further comprising:
- a first mixer, wherein the load element of the amplifier stage and the first mixer are looped in series between the supply voltage and a terminal of the transistor of the amplifier stage; and
- a second mixer, wherein the load element of the observer stage and the second mixer are looped in series between the supply voltage and a terminal of the transistor of the observer stage, and wherein the second mixer replicates the first mixer.

11. The amplifier circuit according to claim 1, further comprising:
- a first cascode circuit, wherein the load element of the amplifier stage and the first cascode circuit are looped in series between the supply voltage and a terminal of the transistor of the amplifier stage; and
- a second cascode circuit, wherein the load element of the observer stage and the second cascode circuit are looped in series between the supply voltage and a terminal of the transistor of the observer stage, and the second cascode circuit replicates the first cascode circuit.

12. The amplifier circuit according to claim 2, wherein the transistor of the amplifier stage and the transistor of the observer stage are bipolar transistors.

13. The amplifier circuit according to claim 2, wherein the transistor of the amplifier stage and the transistor of the observer stage are MOS transistors.

14. The amplifier circuit according to claim 1, wherein the regulator and/or the control element are digital.

15. The amplifier circuit according to claim 1, wherein the observer stage replicates the amplifier stage in such a way that there is a predefined ratio between elements of the amplifier stage and the corresponding elements of the observer stage relative to element parameters.

* * * * *